United States Patent
Narwankar et al.

(10) Patent No.: US 6,337,289 B1
(45) Date of Patent: Jan. 8, 2002

(54) METHOD AND APPARATUS FOR INTEGRATING A METAL NITRIDE FILM IN A SEMICONDUCTOR DEVICE

(75) Inventors: Pravin Narwankar, Sunnyvale; Turgut Sahin, Cupertino, both of CA (US)

(73) Assignee: Applied Materials. Inc, Santa Clara, CA (US)

( * ) Notice: Subject to any disclaimer, the term of this patent is extended or adjusted under 35 U.S.C. 154(b) by 0 days.

(21) Appl. No.: 09/405,554

(22) Filed: Sep. 24, 1999

(51) Int. Cl.[7] ............................................. H01L 21/469
(52) U.S. Cl. ...................... 438/776; 438/775; 438/777; 438/396
(58) Field of Search ................................ 438/308, 381, 438/775, 776, 777, 795, 396

(56) References Cited

U.S. PATENT DOCUMENTS

| | | | | |
|---|---|---|---|---|
| 5,725,740 A | * | 3/1998 | Raaijmakers | 204/192.12 |
| 5,910,880 A | * | 6/1999 | DeBoer et al. | 361/311 |
| 6,001,741 A | * | 12/1999 | Alers | 438/706 |
| 6,071,572 A | * | 6/2000 | Mosely et al. | 427/570 |

\* cited by examiner

*Primary Examiner*—Trung Dang
(74) *Attorney, Agent, or Firm*—Blakely Sokoloff Taylor & Zafman

(57) ABSTRACT

The present invention describes a method of processing a substrate. According to the present invention a dielectric layer is formed on the substrate. The dielectric layer is then exposed in a first chamber to activated nitrogen atoms formed in a second chamber to form a nitrogen passivated dielectric layer. A metal nitride film is then formed on the nitrogen passivated dielectric layer.

10 Claims, 7 Drawing Sheets

METHOD AND APPARATUS FOR INTEGRATING A METAL NITRIDE FILM IN A SEMICONDUCTOR DEVICE

BACKGROUND OF THE INVENTION

1. Field of the Invention

The present invention relates to the field of semiconductor processing and more specifically to a method and apparatus for integrating a metal-nitride film in a semiconductor device.

2. Discussion of Related Art

Integrated circuits are made up of literally millions of active and passive devices such as transistors, capacitors and resistors. In order to provide more computational power and/or more storage capability in an integrated circuit, device features are reduced or scaled down in order to provide higher packing density of devices. An important feature to enable scaling of devices is the ability to form high quality, high dielectric constant films for capacitor and gate dielectrics.

Metal-oxides (ceramics) films, such as tantalum pentaoxide ($TaO_5$) and titanium oxide ($TiO_2$) have been proposed to fill the need for high dielectric constant films. In some processes, metal nitride barrier layers such as titanium-nitride (TiN) and tantalum-nitride (TaN) are used to separate metal oxide dielectrics from metals films, such as tungsten, used to form capacitors and gate electrodes. A barrier layer is used to prevent metal atoms in the capacitor or gate electrode from stealing oxygen atoms from the metal oxide dielectric and causing vacancies therein which can lead to high leakage currents. In other processes metal nitride films form capacitor or gate electrode. Unfortunately, however, present methods of forming metal nitrides, such as thermal chemical vapor deposition, have been found to alter metal-oxide dielectric film qualities and lead to a degradation in performance and reliability of the fabricated devices.

Thus, what is desired is a method and for forming a high quality low resistance metal-nitride film onto a high dielectric constant metal oxide dielectric in a semiconductor device.

SUMMARY OF THE INVENTION

The present invention describes a method of processing a substrate. According to the present invention a dielectric layer is formed on the substrate. The dielectric layer is then exposed in a first chamber to activated nitrogen atoms formed in a second chamber to form a nitrogen passivated dielectric layer. A metal nitride film is then formed on the nitrogen passivated dielectric layer.

BRIEF DESCRIPTION OF THE DRAWINGS

FIG. 2b is an illustration of a cross-sectional view showing the nitrogen passivation of the dielectric on the substrate of FIG. 2a.

FIG. 3b is an illustration of a chamber which may be used in the apparatus of FIG. 3a.

DETAILED DESCRIPTION OF THE PRESENT INVENTION

Figure 1:
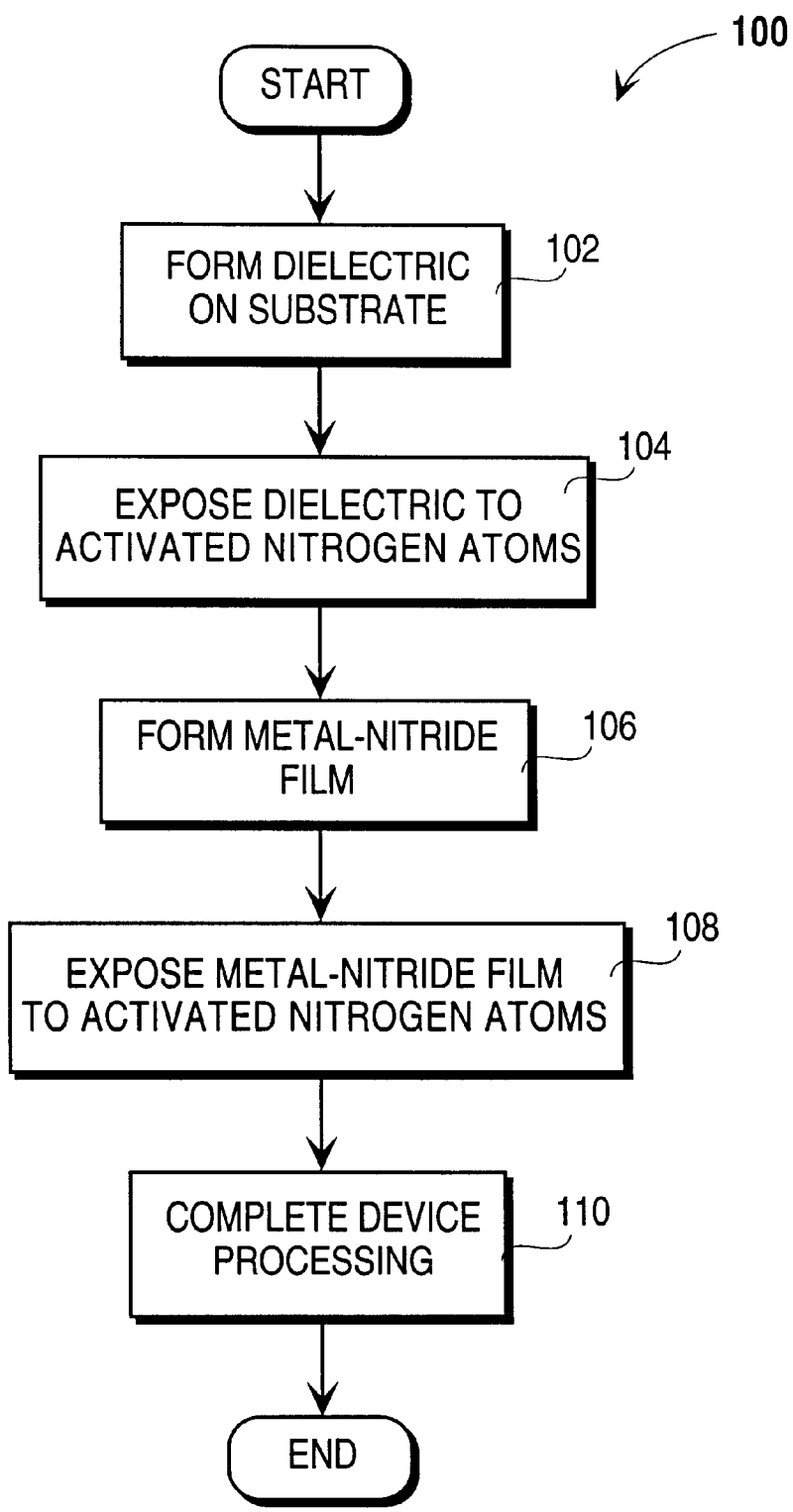
FIG. 1 is a flow chart which illustrates a process of forming a metal-nitride film in a semiconductor device in accordance with the present invention.

The present invention describes a novel method and apparatus for integrating a metal-nitride film into a semiconductor device. In the following description numerous specific details such as specific equipment configurations, process parameters and implementations are set forth in order to provide a thorough understanding of the present invention. One skilled in the art will appreciate the ability to use alternative configurations and process details to the disclosed specifics without departing from the scope of the present invention. In other instances, well known semiconductor processing equipment and methodology have not been described in detail in order to not unnecessarily obscure the present invention.

The present invention describes a novel method and apparatus for integrating a metal-nitride film, such as titanium nitride (TiN), into a semiconductor device fabrication process. According to an embodiment of the present invention, a high dielectric constant metal-oxide dielectric film, such as tantalum pentaoxide ($TaO_5$), is formed over a substrate. The metal-oxide dielectric is then exposed to remotely generated highly activated nitrogen atoms. A metal nitride film, such as titanium nitride, is then formed over the nitrogen exposed metal-oxide dielectric. The metal-nitride film can be formed by thermal chemical vapor deposition utilizing a metal source, such as titanium tetrochloride ($TiCl_4$), and a nitrogen source, such as ammonia ($NH_3$). Alternatively, the metal nitride film can be formed by plasma enhanced chemical vapor deposition (PECVD) or chemical vapor deposition utilizing remotely generated highly activated nitrogen atoms and a metal source.

By exposing the metal oxide dielectric to highly reactive nitrogen atoms prior to depositing the metal nitride film, the metal oxide dielectric becomes passivated with nitrogen atoms. Passivating the metal oxide dielectric with nitride atoms ensures that there is sufficient nitrogen available to react with the metal atoms during the subsequent CVD process and thereby prevent metal atoms from defusing into the dielectric film and causing undesired alterations of the dielectric film properties.

After the formation of the metal nitride film, the metal nitride film is exposed to remotely generated highly reactive nitrogen atoms. By exposing the metal nitride film to highly reactive nitrogen atoms, nitrogen is stuffed into the metal nitride film thereby preventing subsequent incorporation of oxygen into the film which otherwise could increase the resistance of the metal nitride film by forming metal oxide nitrogen compounds such as TiON and TaON. The metal-nitride formation process of the present invention is ideally suited for forming a capacitor electrode or for forming barrier layer between a capacitor dielectric layer and a capacitor electrode in a high density dynamic random access memory (DRAM). Additionally, the present invention can be used to form metal nitride gate electrodes or barrier layers for MOSFET devices.

A method of forming a metal-nitride film in accordance with the present invention will now be described in reference to FIG. 1 and FIGS. 2a–2e. FIG. 1 illustrates a flow chart which depicts a process of forming a metal-nitride film in a semiconductor device in accordance with the present invention. FIGS. 2a–2e illustrate an embodiment of the present invention where a high quality metal-nitride film is formed as part of a stacked capacitor of a DRAM cell. It is to be appreciated that these specific details are only illustrative of an embodiment of the present invention and are not to be taken as limiting to the present invention.

Figure 3A:
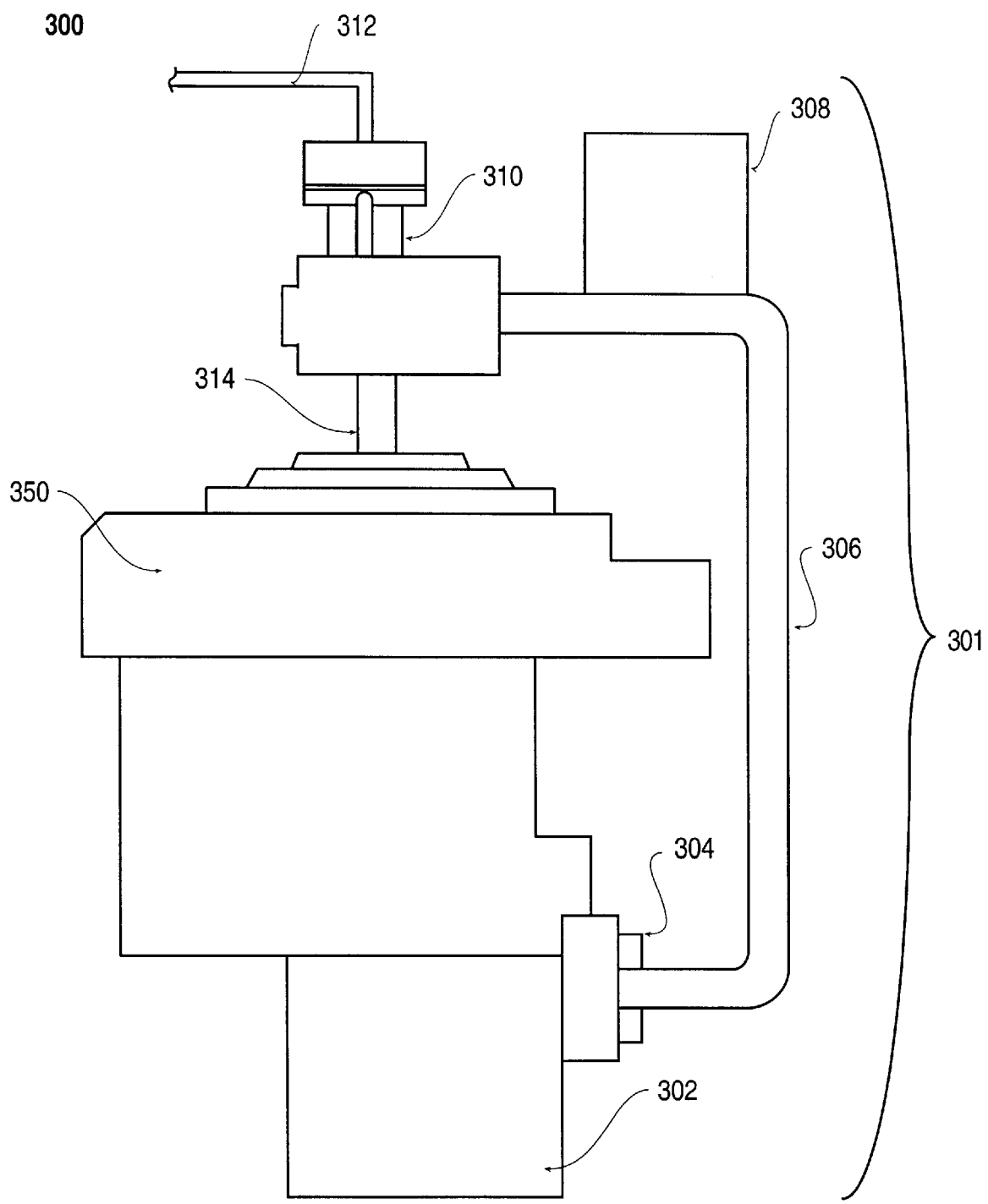
FIG. 3a is an illustration of an apparatus which may be utilized to form a metal nitride film on a metal oxide dielectric film in accordance with the present invention.
Figure 3B:
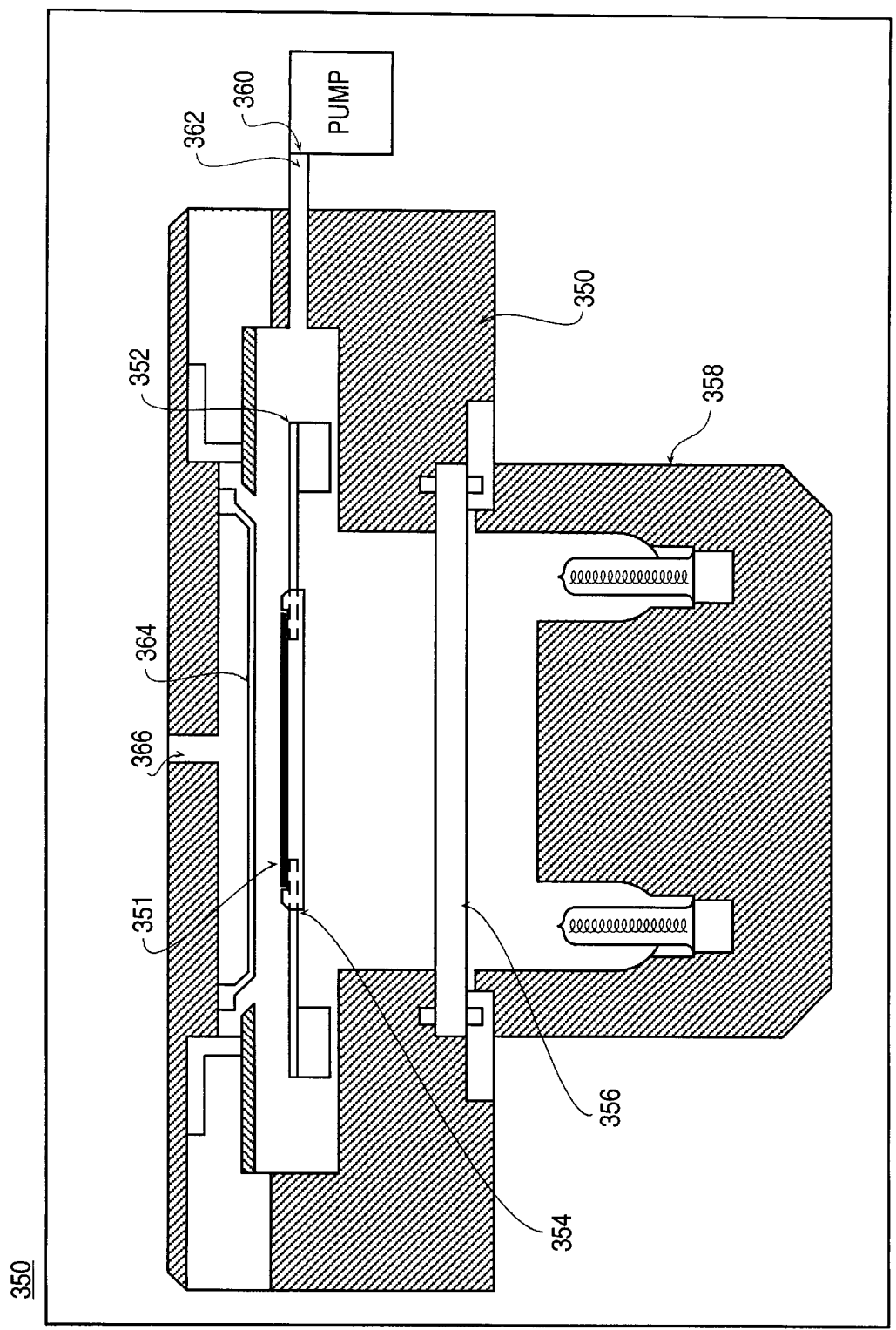

An example of an apparatus 300 which can be used to provide highly activated nitrogen atoms in accordance with the present invention is illustrated in FIGS. 3a and 3b. An example of a commercially available apparatus which can be used to provide active atomic species is the Applied Materials Centura Advanced Strip Passivation Plus (ASP) chamber. Apparatus 300 includes a remote plasma generator 301 which generates and provides active atomic species to a process chamber 350 in which the substrate to be passivated or annealed is located. Remote plasma generator 301 includes a magnatron 302 which generates microwaves with a microwave source. Magnatron 302 can preferably generate up to 10,000 watts of 2.5 Ghz microwave energy. It is to be noted that the amount of power required is dependent (proportional) to the size of anneal chamber 350. For an anneal chamber used to process 300 mm wafers, 10,000 watts of power should be sufficient. Although a microwave source is used to generate a plasma in apparatus 300, other energy sources such as radio frequency (RF) may be used.

Magnatron 302 is coupled to an isolator and dummy load 304 which is provided for impedance matching. The dummy load absorbs the reflected power so no reflective power goes to the magnatron head. Isolator and dummy load 304 is coupled by a wave guide 306, which transmits microwave energy to an autotuner 308. Autotuner 308 consist of an impedance matching head and a separate detector module that uses three stepper motor driven impedance matching stubs to reduce the reflective power of the microwave energy directed to the power source. Autotuner 308 focuses the microwave energy into the center of a microwave applicator cavity (or chamber) 310 so that energy is absorbed by annealed gas fed into the applicator cavity 310. Although an autotuner is preferred a manual tuner may be employed.

Applicator 310 uses microwave energy received from magnatron 302 to create a plasma from the anneal gas as it flows down through a quartz plasma tube located inside applicator 310. A source 312, such as a tank, of a anneal gas such as but not limited to $O_2$, $N_2O$, and $N_2$ and $NH_3$ used for generating the active atomic species is coupled to microwave applicator 310. Additionally, a source of an inert gas such as argon (Ar) or helium (He) can also be coupled to applicator 310. A prefire mercury lamp can be used to radiate ultraviolet light into the plasma tube to partially ionize the process gases and thereby make it easier for the microwave energy to ignite the plasma.

The microwave energy from magnatron 302 converts the anneal gas into a plasma which consist of essentially three components; ionized or charged atoms (radicals), activated (reactive) atomic species, and nondissociated anneal gas. For example when $O_2$ is the anneal gas, microwave energy disassociates the $O_2$ gas into oxygen radicals, reactive oxygen atoms, and some anneal gas remains as $O_2$ molecules. When $N_2$ is the anneal gas, microwaves disassociate the $N_2$ gas into nitrogen radicals, reactive nitrogen atoms, and some anneal gas remains as $N_2$ molecules. Reactive atomic species such as reactive oxygen atoms or reactive nitrogen atoms are not charged or ionized but are highly energized atoms. Because the reactive atomic species are highly energized they are in a highly reactive state so they readily react with dielectric films to fill vacancies therein or to passivate films or substrates. Because the atomic species are highly energized when they enter anneal chamber 350, high temperatures are not necessary in chamber 350 to activate the anneal gas.

Applicator 310 is bolted to the lid of chamber 350. The concentrated plasma mixture flows downstream through conduit 314 to chamber 350. As a plasma flows through the conduit 314 the ionized atoms become electrically neutral before reaching chamber 350 and become highly reactive atomic species. Thus, only electrically neutral, highly reactive atoms flow into chamber 350. Although the process gas at this point is highly reactive, the mixture is no longer electrically damaging to the substrate or electrical devices such as transistors formed therein. Because the active atomic species are generated at location (chamber 310) which is separate or remote from the chamber 350 in which the substrate to be annealed is located, the active atomic species are said to be "remotely generated".

Chamber of 350 of apparatus 300, as shown in FIG. 3b, includes a wafer support 352 for supporting a wafer or substrate 351 face up in chamber 350. Wafer support 352 can include an aluminum chuck 354. Chamber 350 includes a quartz window 356 through which infrared radiation from a plurality (14) of quartz tungsten halogen lamp 358 is transmitted. During processing, the lamps mounted directly below the process chamber radiantly heat the chuck which in turn heats the wafer by conduction. A closed loop temperature control system senses the temperature of the substrate or wafer using a thermocouple mounted in the chuck. The temperature control system regulates the temperature of the wafer by varying the intensity of lamps 358. Although lamps are shown as the heat source for heating the wafer, other heat sources, such as resistive heaters, can be used. A vacuum source 360, such as the pump, is coupled to an exhaust outlet 362 and controls the chamber pressure and removes gas by products. A shower head or gas distribution plate 364 is mounted directly above the wafer. Shower head 364 consist of three quartz plates having a plurality of holes formed therein to evenly distribute the active atomic species over the wafer as they flow through gas inlet 366.

In one embodiment of the present invention, chamber 350 is also configured to receive deposition gases used to deposit a film by chemical vapor deposition (CVD). In this way, a film can be exposed to highly activated atomic species in the same chamber as used to deposit the film, or the film can be annealed as it is deposited. Additionally, chamber 350 can be a thermal reactor such as the Applied Material's Poly Centura single wafer chemical vapor deposition reactor or the Applied Material's RTP Centura with the honeycomb source, each configured to receive active atomic species from remote plasma generator 301. In one embodiment of the present invention apparatus 300 is part of a cluster tool which includes among other chambers, a chemical vapor deposition (CVD) chamber, a load lock, and a transfer chamber with a robot arm. Configuring the various chambers around a transfer chamber in the form of a cluster tool enables wafers or substrates to be transferred between the various chambers of the cluster tool without being exposed to an oxygen ambient.

In order to form a dielectric and metal nitride film in accordance with the present invention a substrate is provided. For the purpose of the present invention a substrate is the material on which a dielectric and metal-nitride film is deposited in accordance with the present invention. The substrate can be a substrate used in the manufacturing of semiconductor products such as silicon substrates and gallium arsenide substrates and can be other substrates used for other purposes such as substrates used in the production of flat panel displays.

Figure 2A:
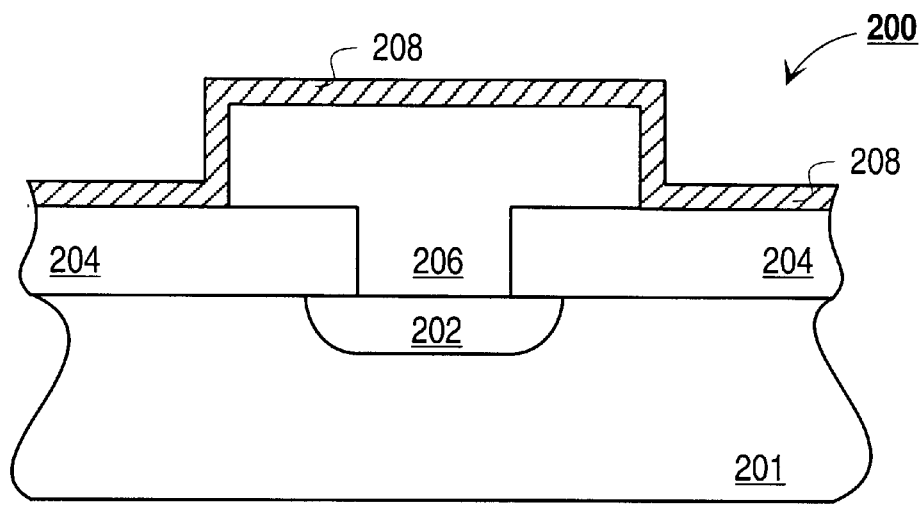
FIG. 2a is an illustration of a cross-sectional view showing the formation of a dielectric film on a substrate.

In one embodiment of the present invention, the substrate can be a substrate used to fabricate of a dynamic random access memory (DRAM) cells such as substrate 200 shown in FIG. 2a. Substrate 200 includes well known silicon epitaxial substrate 201 having a doped region 202 formed therein and a pattern interlayer dielectric 204 formed thereon. A bottom capacitor electrode 206 is formed in contact with the diffusion region 202 and over ILD 204. Bottom capacitor electrode 206 can be formed by any well known technique such as by blanket depositing a polysilicon layer by chemical vapor deposition (CVD) utilizing a reactive gas comprising silane and $H_2$ and then patterning the blanket deposited material into an electrode by well known photolithography and etching techniques. Bottom electrode 206 can also be other types of capacitor electrodes such as but not limited to hemispherical grained polysilicon (HSG) or "rough poly" electrodes and metal electrodes such as tungsten. Additionally, as is well known in the art, silicon substrate 201 can act as bottom electrode 206 if desired.

The first step of the present invention, asset for the in block 102 of flow chart 100 is to form a dielectric layer 208 on substrate 200 as shown in FIG. 2a. In one embodiment of the present invention a high dielectric constant dielectric film 208 is blanket deposited over ILD 204 and bottom electrode 206 of substrate 200 as shown in FIG. 2a. In an embodiment of the present invention the dielectric film is a metal-oxide dielectric film such as, but not limited to, tantalum pentaoxide ($TaO_5$) and titanium oxide ($TiO_2$). In another embodiment dielectric layer 208 is a tantalum pentaoxide film doped with titanium. In another embodiment dielectric layer 208 is a composite dielectric film comprising a stack of different dielectric films such as but not limited to a $TaO_5/TiO_2/TaO_5$ stacked dielectric film. Additionally, in yet another embodiment dielectric layer 208 is a piezoelectric dielectric such as Barrium Strontium Titanate (BST) and Lead Zerconium Titanate (PZT) or is a ferroelectric.

In order to form a metal oxide dielectric layer 208 onto a substrate such as substrate 201, the substrate can be placed into a thermal chamber such as chamber 350 of heating apparatus 300. The substrate is then heated to a desired deposition temperature while the pressure within the chamber is pumped down (reduced) to a desired deposition chamber. Reactant gases including a metal source and an oxygen source are then fed into the chamber where they thermally decompose and then combine to form dielectric layer.

To blanket deposit a tantalum pentaoxide ($Ta_2O_5$) dielectric film by thermal chemical vapor deposition a deposition gas mix comprising, a source of tantalum, such as but not limited to, TAETO [Ta $(OC_2H_5)_5$] and TAT-DMAE [Ta $(OC_2H_5)_4$ $(OCHCH_2N(CH_3)_2]$, and source of oxygen such as $O_2$ or $N_2O$ can be fed into a deposition chamber while the substrate is heated to a deposition temperature of between 300–500° C. and the chamber maintained at a deposition pressure of between 0.5–10 Torr. The flow of deposition gas over the heated substrate results in thermal decomposition of the metal organic Ta-containing precursor an subsequent deposition of a tantalum pentaoxide film. In one embodiment TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, $H_2$ and He, at a rate of between 0.5–2.0 SLM can be used to transport the vaporized TAETO or TAT-DMAE liquid into the deposition chamber. Deposition is continued until a dielectric film 208 of a desired thickness is formed. A tantalum pentaoxide ($Ta_2O_5$) dielectric film having a thickness between 50–200 Å provides a suitable capacitor dielectric.

It has been found that the use of nitrous oxide ($N_2O$) as the oxidizer (source of oxygen), as opposed to oxygen gas $O_2$ improves the electrical properties of the deposited tantalum pentaoxide ($Ta_2O_5$) dielectric film during deposition. The use of $N_2O$, as opposed to $O_2$, has been found to reduce the leakage current and enhance the capacitance of fabricated capacitors. The inclusion of $N_2O$ as an oxidizer aids in the removal of carbon from the film during growth which helps to improve the quality of the film.

In an embodiment of the present invention dielectric layer 208 is a tantalum pentaoxide ($Ta_2O_5$) film doped with titanium (Ti). A tantalum pentaoxide film doped with titanium can be formed by thermal chemical vapor deposition by providing a source of titanium, such as but not limited to TIPT ($C_{12}H_{26}O_4Ti$), into the process chamber while forming a tantalum pentaoxide film as described above. TIPT diluted by approximately 50% with a suitable solvent such as isopropyl alcohol (IPA) can be fed into the process chamber by direct liquid injection or through the use of a bubbler and carrier gas such as $N_2$. A TIPT diluted flow rate of between 5–20 mg/minute can be used to produce a tantalum pentaoxide film having a titanium doping density of between 5–20 atomic percent and a dielectric constant between 20–40. The precise Ti doping density can be controlled by varying the tantalum source flow rate relative to the titanium source flow rate. It is to be appreciated that a tantalum pentaoxide film doped with titanium atoms exhibits a higher dielectric constant than an undoped tantalum pentaoxide film.

After depositing a metal-oxide dielectric it may necessary to anneal the dielectric in an ambient comprising oxygen in order to fill vacancies in the film and to improve the over all quality of the deposited film. In an embodiment of the present invention the metal-oxide dielectric film 208 is annealed with highly activated oxygen atoms formed in a chamber (310) which is remote from the chamber (350) in which the substrate being annealed is located. Highly activated oxygen atoms can be formed by flowing $O_2$ or $N_2O$ gas into chamber 310 and then disassociating the gas with microwaves. A metal oxide dielectric can be sufficiently annealed by flowing activated oxygen atoms into chamber 350 for between 30–120 seconds while substrate 200 is heated to a temperature between 300–400° C. and chamber 350 at a pressure of about 2 torr.

In other embodiments of the present invention dielectric layer 208 need not necessarily be a metal-oxide dielectric layer but can be a silicon-oxide dielectric such as silicon dioxide and silicon oxynitride and composite the siliconoxide and silicon nitride film such as ONO and NO and nitrided oxides. The fabrication of such oxides are well known and can be used in the fabrication of gate dielectric layers and capacitor dielectrics. For example a low temperature silicon dioxide film can be formed by chemical vapor deposition utilizing a silicon source, such as TEOS, and oxygen $O_2$ gas.

Figure 2B:
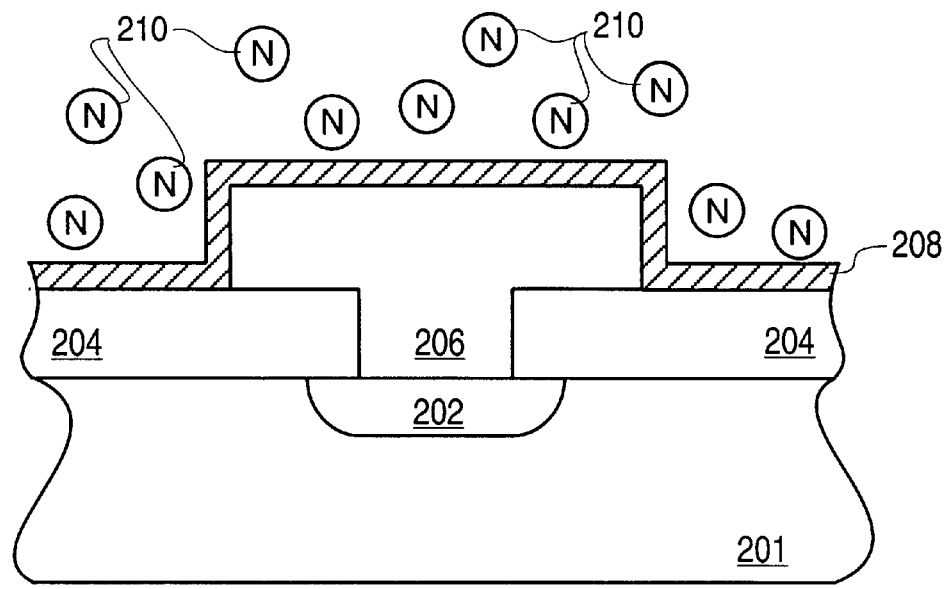

Next, as set forth in block 104 and illustrated in FIG. 2b, dielectric layer 208 is passivated with remotely highly reactive nitrogen 210 atoms prior to depositing a metal-nitride film. Metal-oxide dielectric 208 can be passivated by placing substrate 200 into chamber 350 and then exposing substrate 200 to highly reactive nitrogen atoms 210 formed by disassociating a nitrogen containing gas, such as but not limited to $N_2$, and $NH_3$, in disassociation chamber 310 of remote plasma generator 300. Exposing substrate 200 to remotely generated activated nitrogen atoms passivates dielectric film 208 with nitrogen atoms. Passivating dielectric film 208 with activated nitrogen atoms prevents metal atoms provided during the subsequent metal-nitride deposition step from diffusing into the dielectric film and causing uncontrolled alterations of film properties.

For example, if a titanium nitride (TiN) film is to be formed onto a tantalum pentaoxide ($TaO_5$) dielectric film, if the dielectric film was not first passivated with reactive nitrogen atoms, then titanium could diffuse into the tantalum pentaoxide film and form titanium oxide compounds which could affect the electrical properties of the film. By initially passivating dielectric film 208 with activated nitrogen atoms 210, nitrogen is readily available to react with the metal atoms and thereby prevent the metal atoms from diffusing into the dielectric film and causing undesired alteration of film properties.

Dielectric film 208 can be sufficiently passivated by exposing substrate 200 to highly active nitrogen atoms for between 10–60 seconds while substrate 200 is heated to a temperature between 350–450° C. while chamber 350 is maintained at a pressure less than 10 torr. Reactive nitrogen atoms can be formed by feeding between 1–5 slm of $N_2$ or $NH_3$ gas into applicator 310 and disassociating the gas with microwaves or RF.

Figure 2C:
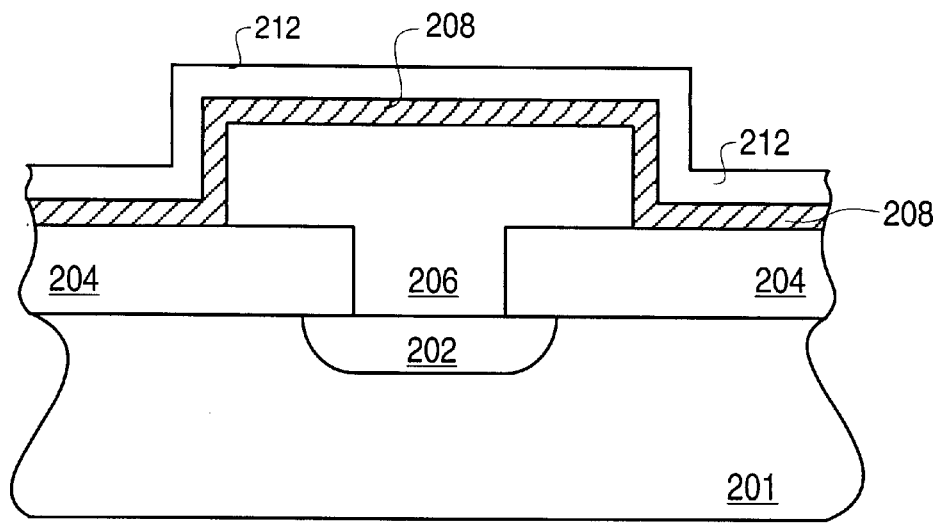
FIG. 2c is an illustration of a cross-sectional view showing the formation of a metal nitride on the substrate of FIG. 2b.

Next, as set forth in block 108 of flow chart 100 and shown in FIG. 2c, a metal-nitride film 212 is formed on nitrogen passivated dielectric film 208.

In one embodiment of the present invention the metal nitride film 212 is titanium nitride formed by thermal chemical vapor deposition. A titanium nitride film can be formed by thermal chemical vapor deposition onto dielectric layer 208 by providing titanium tetrachloride ($TiCl_4$) and ammonia ($NH_3$) into deposition chamber 350 while substrate 200 is heated to a temperature between 550–680° C. $TiCl_4$ can be fed into deposition chamber 350 by direct liquid injection or through the use of a bubbler. Heat from substrate 200 causes the titanium tetrachloride ($TiCl_4$) to decompose and provide titanium atoms and causes the ammonia ($NH_3$) to decompose and provide nitrogen atoms. The nitrogen atoms and the titanium atoms then combine together to form a titanium nitride film.

In a preferred embodiment of the present invention $TiCl_4$ is fed into chamber 350 prior to beginning the flow of ammonia ($NH_3$) into chamber 350. In this way the substrate 200 is titanium rich, and sufficient titanium is available to react with the ammonia as it flows into the chamber. When ammonia ($NH_3$) enters the chamber it breakdown into nitrogen, N-H molecules and hydrogen atoms. If hydrogen atoms are able to react with the metal oxide dielectric they can reduce the metal oxide (TaO5) into metal (Ta) which can cause the metal oxide dielectric to have high leakage. By saturating substrate 200 with titanium prior to beginning the flow of ammonia ($NH_3$), titanium nitride forms immediately and prevents hydrogen from reducing the metal oxide dielectric.

To deposit a metal-nitride film in accordance with another embodiment of present invention, a source of metal atoms such as but not limited to a metal organic precursors such as TiPT ($C_{12}H_{26}O_4Ti$), TAETO [Ta $(OC_2H_5)_5$], TAT-DMAE [Ta $(OC_2H_5)_4$ $(OCHCH_2N(CH_3)_2]$, is fed into a deposition chamber 350 along with highly activated nitrogen atoms formed in disassociation chamber 310. Heat from substrate 200 causes the metal organic precursor to disassociate and provide metal atoms which combine with the highly activated nitrogen atoms to form a metal-nitride film 212. The deposition temperature of the substrate should be sufficient to thermally decompose the metal source without the use of additional decomposition sources such as plasma or photon enhancement.

Figure 4:
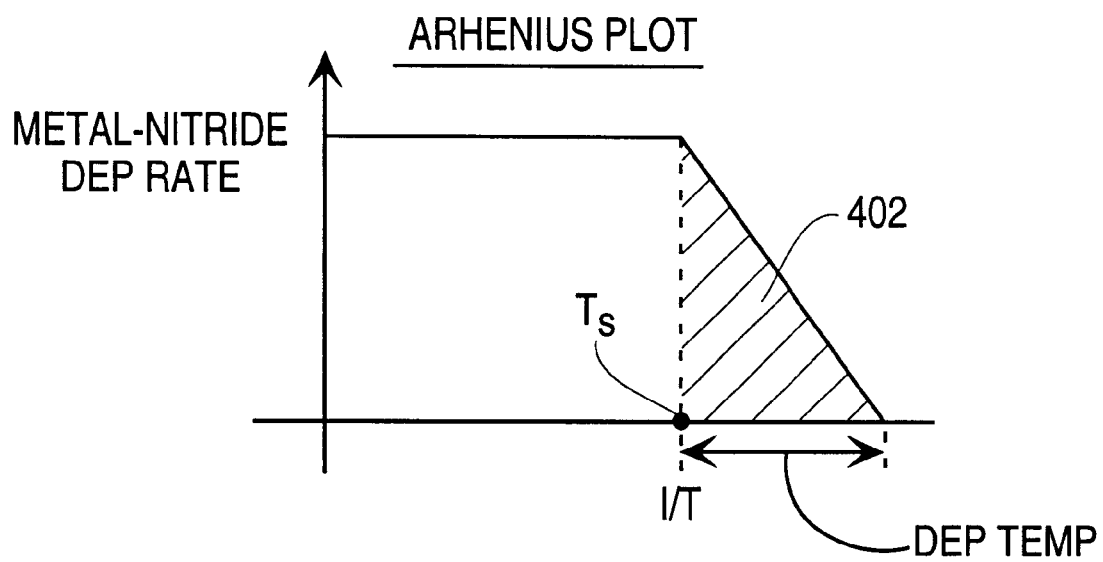
FIG. 4 is an illustration of an Arhenius Plot depicting how deposition rate varies with respect to the inverse of deposition temperature for the formation of a metal nitride film.

In an embodiment of the present invention, the deposition temperature (temperature of the substrate) is chosen to be in the region of "slope" for an Arhenius plot of the metal-nitride film. For example, FIG. 4 illustrates Arhenius plot for a metal-nitride film wherein the deposition rate of the film is plotted against the inverse of the deposition temperature (1/T). As shown in FIG. 4, the deposition rate is constant for deposition temperatures greater than $T_s$ where as for temperatures less than $T_s$ (i.e., the slope portion 402 of the plot) the deposition rate falls with decreases in deposition temperature. By operating at a deposition temperature in the "slope region" the reaction of the metal with highly activated nitrogen atoms is not immediate. By lowering deposition temperature and slowing down the reaction, metal atoms are able to migrate into the high aspect ratio openings before reacting with the highly reactive nitrogen atoms. In this way high aspect ratio openings greater than 2:1 and even as high as 5:1 can be reliably filled with a metal-nitride film.

A titanium nitride (TiN) film can be formed by flowing a titanium organic precursor such as but not limited to TiPT ($C_{12}H_{26}O_4Ti$), into deposition chamber 250 at a rate of between 5–100 milligrams/minute while the substrate is heated to a deposition temperature of between 350–450° C. with a deposition chamber pressure of between 1–5 torr while activated nitrogen atoms generated in chamber 310 are fed into deposition chamber 350 at a rate of between 1–5 slm. Activated nitrogen atoms can be generated by feeding between 1–5 slm of $N_2$ or $NH_3$ into chamber 310 and disassociating the gas with microwaves or RF. The titanium organic precursor can be fed into chamber 13 by direct liquid injection or through the use of a bubbler. Such conditions can produce a uniform and conformal titanium nitride film in high aspect ratio openings at a rate of between 10–110 angstroms/minutes.

A tantalum nitride film can be formed by flowing a tantalum organic precursor such as but not limited to TAETO [Ta $(OC_2H_5)_5$], and TAT-DMAE [Ta $(OC_2H_5)_4$ $(OCHCH_2N(CH_3)_2]$, into deposition chamber 350 at a rate of between 10–50 mg/min while the substrate is heated to a deposition temperature of between 350–500° C. with a deposition chamber pressure of between 1–5 torr while activated nitrogen atoms are fed into the deposition chamber 350 at a rate of between 1–5 slm. Activated nitrogen atoms can be generated by feeding between 1–5 slm of $N_2$ or $N_3$ into chamber 310 and disassociating the gas with microwaves. The tantalum organic precursor can be fed into chamber 350 by direct liquid injection or through the use of a bubbler.

It is to be appreciated that by utilizing the pre-nitrogen passivation step of the present invention, deposition of the metal-nitride film can begin by simply beginning the flow of the metal precursor into chamber 350 while activated nitrogen atoms continue to be fed from the nitrogen passivation step.

After a sufficiently thick metal-nitride film 212 is deposited the deposition is stopped. In an embodiment of the present invention a metal-nitride film 212 is formed to a thickness between 30–100 Å.

Figure 2D:
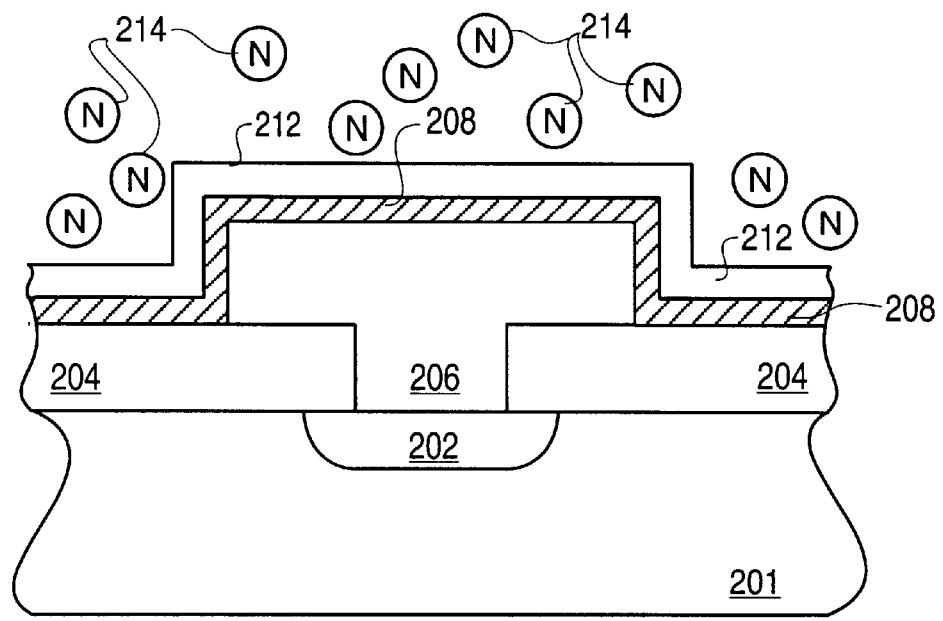
FIG. 2d is an illustration of a cross-sectional view showing the substrate of FIG. 2c being exposed to highly reactive nitrogen atoms.

In a preferred embodiment of the present invention, as set forth in block 110, and illustrated in FIG. 2d after formation of a metal-nitride film, the metal nitride film is exposed to remotely generated activated nitrogen atoms. By exposing the metal-nitride film 212 to activated nitrogen atoms 214, nitrogen atoms are stuffed into the metal-nitride film 212. Stuffing the nitrogen atoms into the metal-nitride film prevents reaction of metal atoms (e.g., Ti or Ta) with oxygen which can lead to increased resistance of the metal-nitride film due to the incorporation of metal oxide compounds such as TiON and TaON.

A metal-nitride film can be stuffed with nitrogen atoms by feeding activated nitrogen atoms into deposition chamber 350 for between 10–60 seconds at a rate of between 1–5 slm while the substrate is heated to a temperature of between 350–450° C. Activated nitrogen atoms can be generated by feeding between 1–5 slm of $N_2$ or $NH_3$ into chamber 310 and disassociating the gas with microwaves or RF.

Figure 2E:
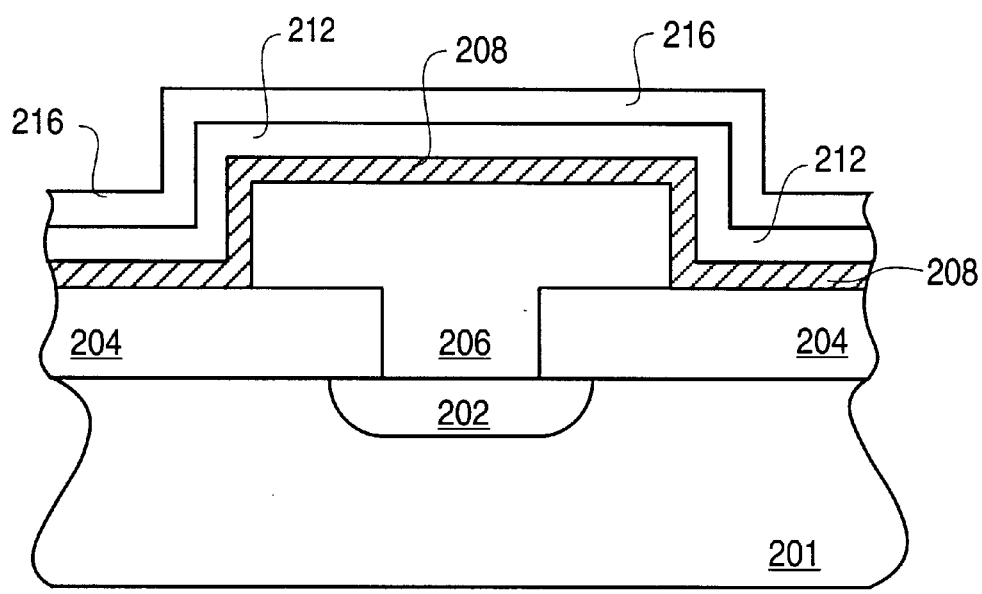
FIG. 2e is an illustration of a cross-sectional view showing further processing of the substrate of FIG. 2d.

The next step of the present invention, as set forth in block 210 of flow chart 200 is to complete the processing of the device. For example, as shown in FIG. 2e, a top capacitor electrode 216 can be formed over metal-nitride layer 212 if desired. Any well known technology can be used to form top electrode 216 including blanket depositing metal film such as tungsten over metal-nitride barrier layer 212 and then using well known photolithography and etching techniques to pattern the electrode film, the metal-nitride film 212 and dielectric layer 208. The use of a metal-nitride barrier 212 between a metal oxide dielectric film 208 such as tantalum pentaoxide, and a capacitor electrode 216 is desired because it prevents metal from the capacitor electrode 216 from pulling away oxygen molecules from metal-oxide dielectric 208 and creating charge vacancies which can lead to high leakage currents.

Although the present invention has been described with respect to the fabrication of a stacked capacitor of a DRAM cell, it is to be appreciated that the present invention can be used or integrated into the fabrication of other semiconductor devices such as metal oxide semiconductor devices and bipolar devices. For example in the fabrication of an MOS device, a high dielectric constant film, such as a metal oxide dielectric, would be formed on a doped silicon epitaxial layer of a semiconductor layer substrate. The metal oxide dielectric would then be exposed to highly activated (reactive) remotely generated nitrogen atoms. A metal nitride film, such as TiN or TaN, would then be blanket deposited over the nitride exposed metal oxide dielectric. The metal nitride film would then be exposed to highly activated (reactive) nitrogen atoms to stuff the metal nitride film with nitrogen atoms. The metal nitride film could itself provide the gate electrode or provide a barrier between a metal oxide dielectric and a metal gate electrode, such as tungsten, or a silicon gate electrode, such as polycrystalline silicon. The metal oxide dielectric, the metal nitride film, and any subsequently deposited gate materials would then be patterned into a gate electrode by well known photolithography and etching technique. Standard processing would then be used to form source/drain regions (and LDD regions if desired) on opposite sides of the fabricated gate electrode.

A novel method and apparatus for integrating a metal-nitride film into a semiconductor device has been described.

Although the present invention has been described with respect to specific equipment, and with respect to a specific process (formation of a capacitor electrode) it is to be appreciated that the described details are not to be taken as limiting, but rather as illustrative wherein the scope of the present invention is to be measured by the appended claims which follow.

Thus, a method and apparatus for integrating a metal-nitride film in a semiconductor device has been described.

We claim:

1. A method of processing a substrate, said method comprising the steps of:

forming a dielectric layer on a substrate;

placing said substrate in a first chamber;

dissociating a nitrogen containing gas in a second chamber to form a plasma containing ionized nitrogen atoms;

flowing said ionized nitrogen atoms through a conduit coupling said first chamber and said second chamber so that said ionized nitrogen atoms become electrically neutral activated nitrogen atoms prior to entering said first chamber;

exposing said dielectric layer in said first chamber to said activated nitrogen atoms to form a nitrogen passivated dielectric layer; and forming a metal nitride layer on said nitrogen passivated dielectric layer.

2. The method of claim 1 wherein said dielectric layer is a metal oxide dielectric.

3. The method of claim 2 wherein said metal oxide dielectric layer comprises tantalum pentaoxide ($TaO_5$).

4. The method of claim 1 wherein said metal nitride is titanium nitride.

5. The method of claim 1 further comprising the step of after forming said metal-nitride layer, exposing said metal-nitride layer to activated nitrogen atoms.

6. A method of processing a substrate, said method comprising a step of:

forming a dielectric layer on a substrate;

forming a metal nitride layer on said dielectric layer;

placing said substrate in a first chamber:

dissociating a nitrogen containing gas in a second chamber to form a plasma containing ionized nitrogen atoms;

flowing said ionized nitrogen atoms through a conduit coupling said first chamber and said second chamber so that said ionized nitrogen atoms become electrically neutral activated nitrogen atoms prior to entering said first chamber, exposing said metal nitride layer in said first chamber to said activated nitrogen atoms.

7. The method of claim 6 further comprising the step of prior to forming said metal nitride layer, exposing said dielectric layer in the third chamber to activated nitrogen atoms formed in a fourth chamber.

8. The method of claim 6 wherein said dielectric layer is a metal oxide dielectric.

9. The method of claim 8 wherein said metal oxide dielectric layer comprises tantalum pentaoxide ($TaO_5$).

10. The method of claim 6 wherein said metal nitride is titanium nitride.

* * * * *